United States Patent
Hsu et al.

(10) Patent No.: US 8,072,076 B2
(45) Date of Patent: Dec. 6, 2011

(54) BOND PAD STRUCTURES AND INTEGRATED CIRCUIT CHIP HAVING THE SAME

(75) Inventors: Shih-Hsun Hsu, Hsinchu (TW);
Shih-Puu Jeng, Hsinchu (TW);
Shang-Yun Hou, Hsinchu (TW);
Hsien-Wei Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 654 days.

(21) Appl. No.: 11/545,579

(22) Filed: Oct. 11, 2006

(65) Prior Publication Data
US 2008/0088038 A1  Apr. 17, 2008

(51) Int. Cl.
*H01L 23/48* (2006.01)
*H01L 23/544* (2006.01)
*H01L 29/41* (2006.01)

(52) U.S. Cl. .......... 257/768; 257/48; 257/773; 257/781; 257/784; 257/E21.522; 257/E21.523; 257/E23.151; 438/14; 438/15

(58) Field of Classification Search ............... 257/48, 257/781–786
See application file for complete search history.

(56) References Cited

U.S. PATENT DOCUMENTS

| | | | |
|---|---|---|---|
| 6,765,228 B2* | 7/2004 | Lin et al. | 257/48 |
| 6,844,631 B2 | 1/2005 | Yong et al. | |
| 7,329,951 B2* | 2/2008 | Daubenspeck et al. | 257/737 |
| 2005/0098903 A1* | 5/2005 | Yong et al. | 257/786 |
| 2006/0065969 A1* | 3/2006 | Antol et al. | 257/700 |
| 2007/0045865 A1* | 3/2007 | Tang et al. | 257/778 |

\* cited by examiner

*Primary Examiner* — Ha Tran T Nguyen
*Assistant Examiner* — Raj R Gupta
(74) *Attorney, Agent, or Firm* — Birch, Stewart, Kolasch & Birch, LLP

(57) ABSTRACT

Bonding pad structures and integrated circuits having the same are provided. An exemplary embodiment of a bond pad structure comprises a bond pad layer. A passivation layer partially covers the bond pad layer from edges thereof and exposes a bonding surface, wherein the passivation layer is formed with a recess on at least one edge of the bonding surface to thereby define a probe needle contact area for probe needle testing and a wire bonding area for wire bonding on the bonding surface, and the probe needle contact area and the wire bonding area have a non-overlapping relationship.

10 Claims, 19 Drawing Sheets they wire bonding area 24 overlaps the probe needle contact area 22 on the bond pad 14, the bond ball wire bonded on the bond pad 14 often shows poor adhesion therebetween due to the presence of the probe needle scrub mark 32 and the hump 34 in the surface of the bonding pad 14, thereby causing poor adhesion of the bond ball from the bond pad 14. This increases quality and reliability concerns for bond pads that have been damaged by a probe contact.

BOND PAD STRUCTURES AND INTEGRATED CIRCUIT CHIP HAVING THE SAME

BACKGROUND OF THE INVENTION

1. Field of the Invention

The invention relates to semiconductor devices, and more particularly to a semiconductor device having a bond pad with separate areas for probe needle contact and wire bonding.

2. Description of the Related Art

In integrated circuit manufacturing, wire bonding is a well known method used to connect a semiconductor die having electrical circuitry to a pin on a component package. Within integrated circuit manufacturing it is also a common practice to test the functionality of the semiconductor die before completing component assembly. A "probe test" is a method of testing a semiconductor where a probe contact is commonly used as a mechanical and electrical interface to bond pads on the die.

FIG. 1 illustrates a top view of a bond pad structure 10 formed in a part of an integrated circuit (IC) chip 12 for wire bonding. The bond pad structure 10 includes a bond pad 14, typically rectangular in configuration, which is partially covered by a passivation layer 16. The edges of the bond pad 14 are illustrated by the doted lines in FIG. 1. A pad opening 18 is formed in the passivation layer 16, exposing most of the bond pad 14 for allowing sequential bonding of a bond ball (not shown) thereon. The bond pad 14 electrically contacts an underlying interconnect wiring (not shown). A bond ball (not shown) formed on the bond pad 14 can therefore be connected with a bonding wire (not shown), through a lead (not shown), to the terminals (not shown) on a leadframe or substrate (not shown).

Normally, prior to packaging and formation of the bonding ball on a bond pad 14 exposed by the pad opening 18 in FIG. 1, the IC chip 12 is subjected to parametric testing which utilizes test structures to assess the electrical characteristics and reliability of the devices on the wafer. Probe cards are typically used as an interface between the devices on the chip and automated test equipment. The probe card typically includes a printed circuit board from which multiple probe needles extend, one of the probe needles (illustrated as a probe needle 20 here) is disposed in electrical contact with the device through the bond pad 14, as shown in FIG. 2. The probe needle 20 contacts the bond pad 14 at a probe needle contact area 22 provided on the bond pad 14 in the testing step. Next, a wire bonding area 24 other than that of the probe needle contact area 22 over the bond pad 14 is provided at a place for the sequential wire bonding of a bonding ball in the packaging step. Ideally, the wire bonding area 24 and probe needle contact area 22 of the bond pad 14 are substantially divided by a suppositional line (shown as the dashed line 15 in FIG. 2) and the wire bonding area 24 does not overlap the probe needle contact area 22 since the probe needle 20 typically contacts the bond pad 14 at a typical pressure of about 2-3 grams with a consequently formed scrub mark 32 and hump 34 on pad material the bond pad 14 which cross along the probe needle contact area 22, as shown in FIG. 3 of which a schematic cross section is taken along line 3-3 in FIG. 2.

Nevertheless, with the trend of size reduction in modern deep sub-micron semiconductor technology, bond pad geometry characteristics thereof are also reduced. As the bond pad size is reduced, the ratio of the damage caused by a probe contact to the bond pad area increases. This decreased wire bonding area 24 for the bond ball (not shown) tends to reduce effective bonding of the bond ball to the bond pad 14. Once Thus, there is a need for the ability to circuit probe test a die without causing unreliable wire bonding connections, and to ensure a robust circuit probe test on die with small bond pads. And in many cases, there is a need to meet the preceding criteria without affecting die size to keep costs down. Accordingly, there is an established need for a new layout for clearly distinguishing regions for test probing and wire bonding on the bonding pad.

BRIEF SUMMARY OF THE INVENTION

Accordingly, bonding pad structures and integrated circuit chips having the same are provided. An exemplary embodiment of a bond pad structure comprises a dielectric layer exposed with a bond pad layer. A passivation layer partially overlies the dielectric layer and covers the bond pad layer from edges thereof and exposes a bonding surface therein, wherein the passivation layer is formed with a recess on at least an edge not covering the bonding surface thereof to thereby define a probe needle contact area for probe needle testing and a wire bonding area for wire bonding on the bonding surface, and the probe needle contact area and the wire bonding area have a non-overlapping relationship.

An exemplary embodiment of exemplary embodiment of an integrated circuit chip comprises a dielectric layer exposed with a plurality of bond pads thereon. A plurality of patterned passivation layers overlie portions of the dielectric layer, each partially covers one of the bond pad layers from edges thereof and respectively exposes a bonding surface therein, wherein at least one of the patterned passivation layers is formed with a recess on at least an edge not covering the bonding surface thereof to thereby define a probe needle contact area for probe needle testing and a wire bonding area for wire bonding on the bonding surface, the probe needle contact area and the wire bonding area have a non-overlapping relationship, and the patterned passivation layers covering two adjacent bond pads are isolated from each other by a gap over the dielectric layer defined therebetween.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention includes provides novel bonding pad structures having separate areas on the surface thereof for contact of a probe needle during chip testing and bonding of bond wires to the chip in semiconductor packaging technology. Bond pads of the bond pad structures may have a generally elongated, rectangular configuration with the wire bonding area at one end and a probe needle contact area at the other end of the pad. At least one, and preferably, two alignment guides may be provided on or adjacent to each of the bonding pad structures between the wire bonding area and the probe needle contact area for demarcating these areas during chip production. The bonding pad structures of the present invention are also suitable for wire bonding techniques.

Figure 1:
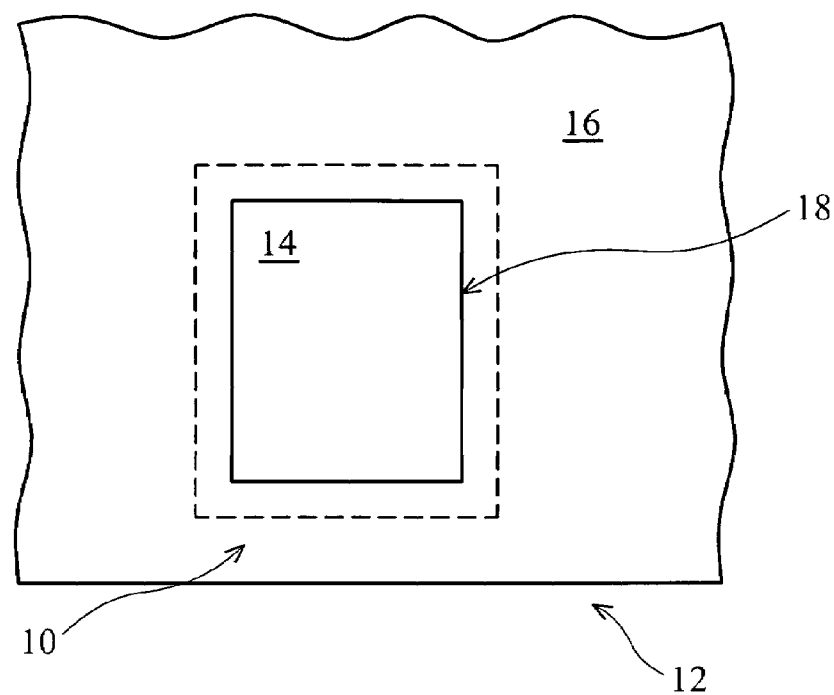
FIGS. 1 and 2 are top views illustrating a related art bond pad structure.
Figure 2:
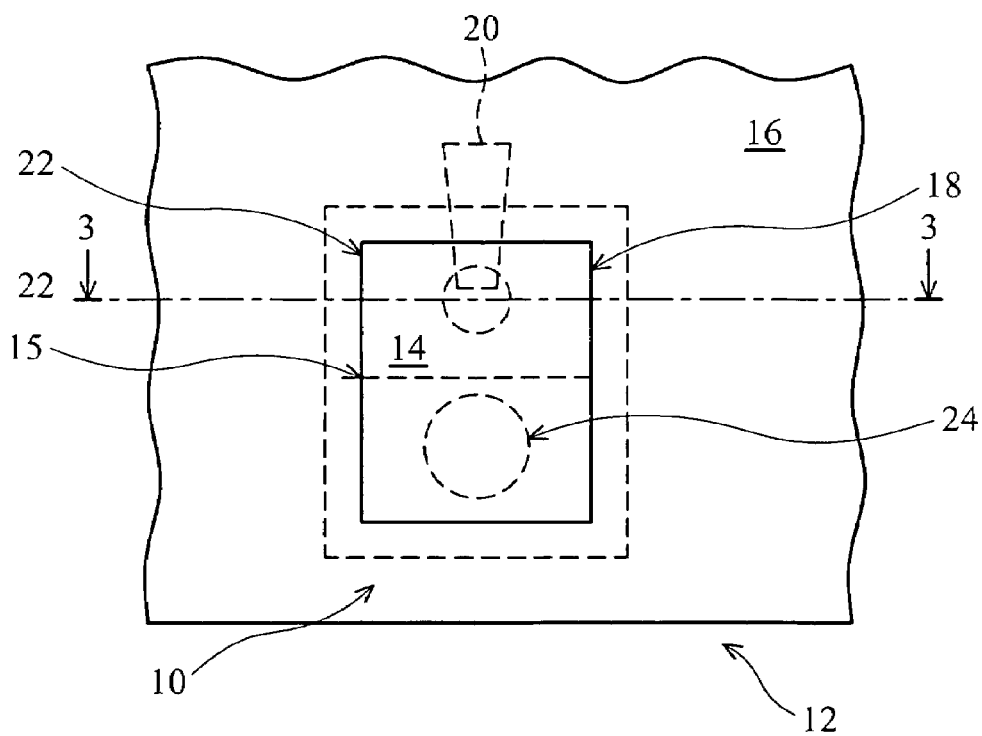
Figure 3:
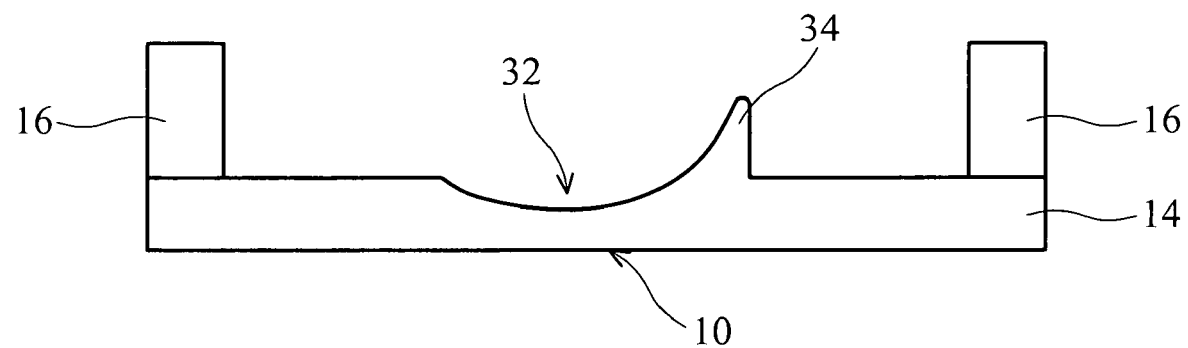
FIG. 3 is a schematic cross section taken along line 3-3 in FIG. 2, showing a bond pad surface damaged by a probe needle contact.
Figure 4:
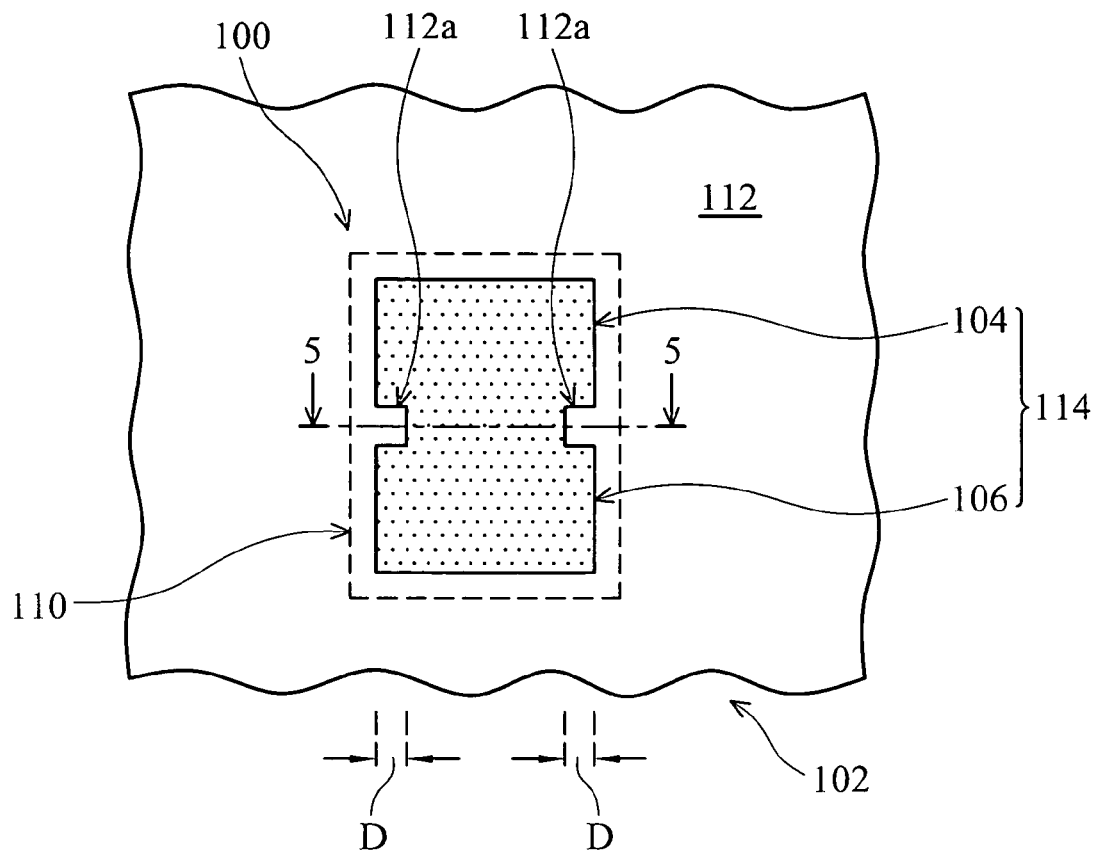
FIG. 4 is a top view of a bond pad structure according to an embodiment of the invention.

FIG. 4 illustrates a top view of a part of an integrated circuit (IC) chip 102 having a bond pad structure 100 in accordance with an embodiment. The integrated circuit chip 102 is provided with a bond pad layer 110 partially covered by a passivation layer 112 from edges thereof and exposes a bonding surface 114. The passivation layer 112 covers the entire surface of the IC chip 102 and further includes two protrusions 112a crossing over a portion of the bonding surface 114 from opposing sides thereof, thereby separating the bond surface 114 into a wire bonding region 104 and a probe needle contact region 106 at two ends thereof, as shown in FIG. 4. The wire bonding region 104 and the probe needle contact region 106 can be laid out and sized as needed to accommodate the size and accuracy of the wire bonding and probing tools through adjusting locations of the protrusions 112a formed on the bonding surface 114. As shown in FIG. 4, the wire bonding region 104 and the probe needle contact region 106 are illustrated with similar sizes but are not limited thereto. In other situations, the regions can be sized differently. The protrusions 112a are in a distance D of about 1~5 μm from edges of the bonding surface 114 and are illustrated with substantially rectangular configuration here, for example, but is not limited thereto. The protrusions 112a can be formed in other suitable shapes such as v-shaped, arcuate, semicircle or the like. The protrusions 112a can be simultaneously formed during patterning of the passivation layer 112 for revealing the bond surface 114.

Figure 5:
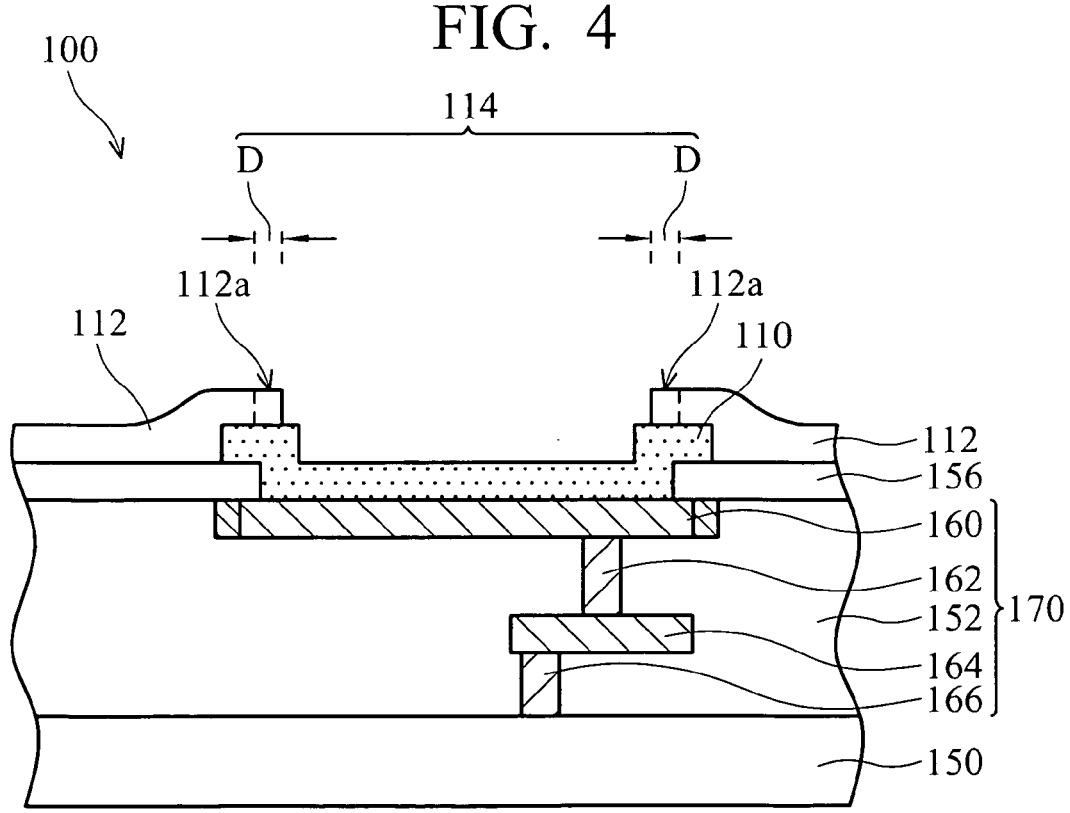
FIG. 5 is a schematic cross section taken along line 5-5 in FIG. 4, showing a bond pad structure according to an embodiment of the invention.

The bond pad structure 100 can be designed as a semiconductor device with a cross section as illustrated in FIG. 5, for example. FIG. 5 is a cross section taken along the line 5-5 in FIG. 4 which crosses over the protrusions of the passivation layer 112. As shown in FIG. 5, the bond pad structure 100 has an interconnect region 170 overlying a substrate 150. The interconnect region 170 includes metal layers 160, 164 and metal plugs 162, 166 formed in a inter-metal dielectric (IMD) layer 152 for routing power, ground, signal, and other lines between various components. A patterned passivation layer 156 is formed on the interconnect region 170 and exposes a portion of the underlying metal layer 160. The bond pad layer 110 is further formed on the exposed portion of the metal layer 160 and the topmost passivation layer 112 covers portions the bond pad layer 110 from edges thereof, thereby defining the bonding surface 114. The passivation layers 112 and 156 can comprise dielectric materials such as silicon nitride or silicon oxide for providing mechanical resistance and anti-moisture permeation characteristics for the adjacent metal layers and bond pad layer 110. The bond pad layer 110 can comprise conductive materials such as copper, aluminum or alloys thereof. Fabrications of the bond pad structure 100 can be achieved by conventional semiconductor fabricating techniques such as film depositions, photolithography, etching and the like, and are well known to those skilled in the art but are not described in detail here, for simplicity.

Figure 6:
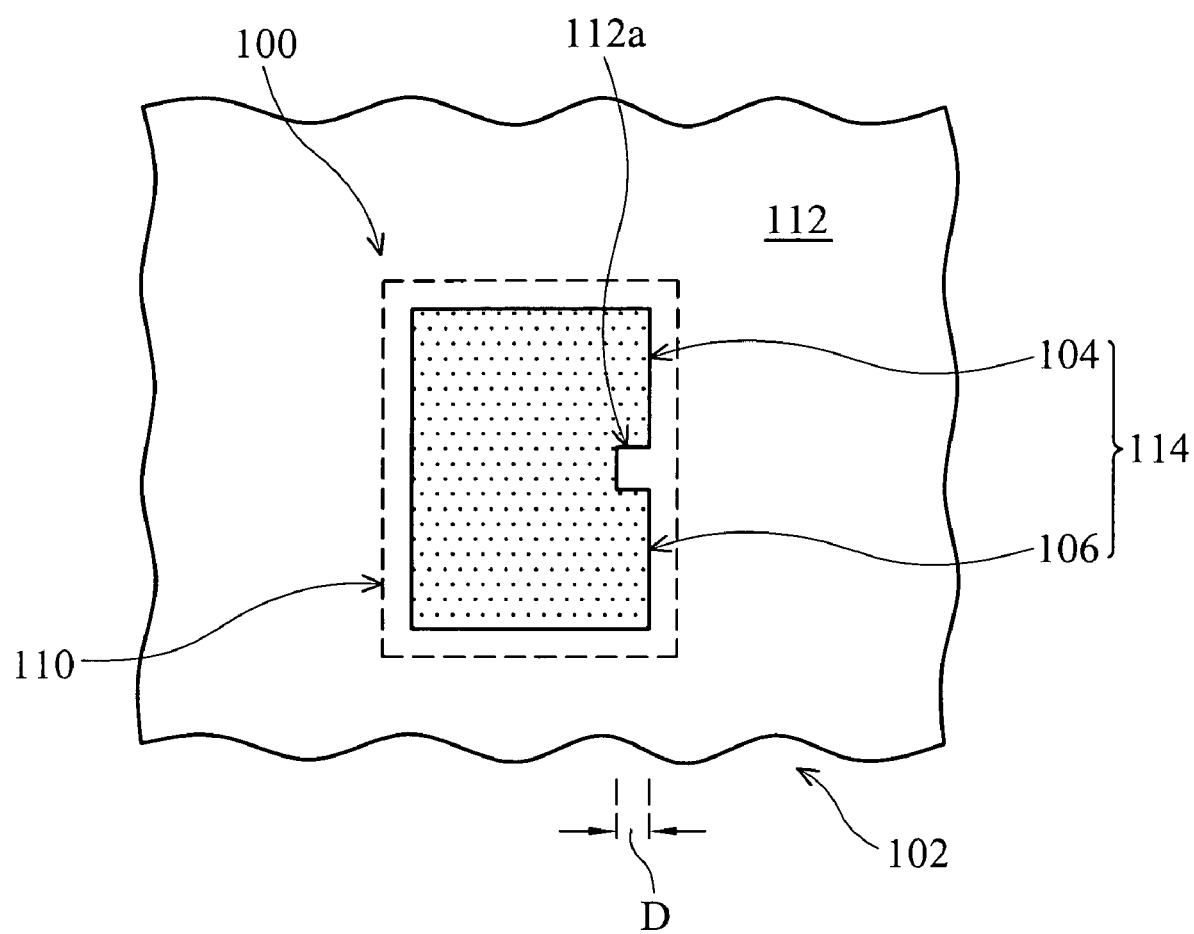
FIG. 6 is a top view of a bond pad structure according to another embodiment of the invention.

As shown in FIG. 5, the protrusions 112a with distances D form an edge of the bonding surface 114 are provided thereon and cross over a portion of the bond pad layer 110, such that functioning as marks for defining the wire bonding region 104 and the probe needle contact region 106 on the bonding surface 114. The bond pad structure 100 can be also designed with only one protrusion 112a partially covering the bonding surface 114 at a side thereof as the mark for defining the wire bonding region 104 and the probe needle contact region 106 thereon, as shown in FIG. 6, wherein the like or similar elements are given same reference numbers as in FIG. 4.

Figure 7:
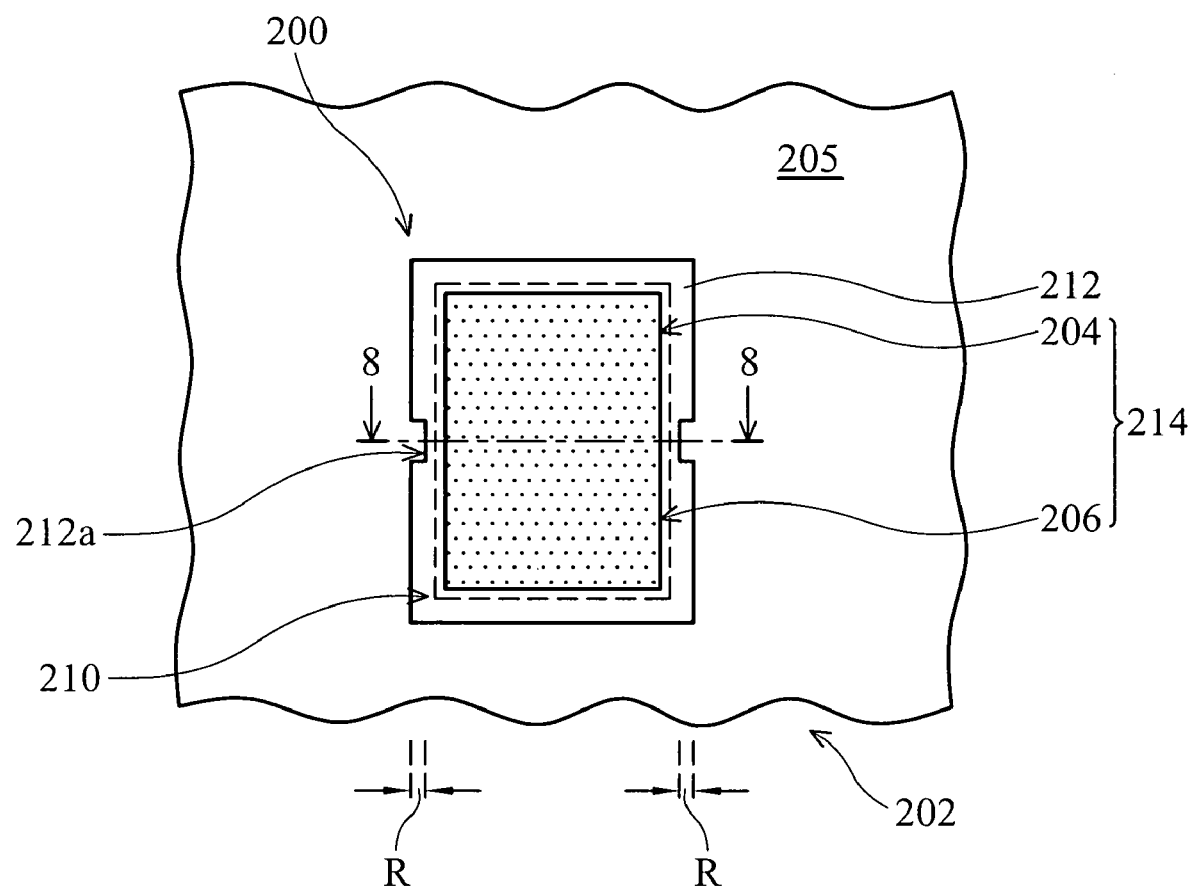
FIG. 7 is a top view of a bond pad structure according to yet another embodiment of the invention.

FIG. 7 illustrates a top view of a part of another embodiment of an integrated circuit (IC) chip 202 having a bond pad structure 200. The IC chip 202 is provided with a bond pad layer 210 formed over a passivation layer 205. The bond pad layer 210 is partially covered by a pattered passivation layer 212 from edges thereof and exposes a bonding surface 214 therein. Herein, the passivation layer 212 merely covers portions of the bond pad layer 210 and portions of the underlying passivation layer 205 adjacent to the bond pad layer 210, the passivation layer 212 now includes two recesses 212a which further expose a portion of the underlying passivation layer 205 from opposing sides thereof, thereby serving as marks for separating the bonding surface 214 into a wire bonding region 204 and a probe needle contact region 206 at two ends thereof, as shown in FIG. 7. The wire bonding region 204 and the probe needle contact region 206 can be laid out and sized as needed to accommodate the size and accuracy of the wire bonding and probing tools through adjusting locations of the recesses 212a formed on the bonding surface 214. As shown in FIG. 7, the wire bonding region 204 and the probe needle contact region 206 are illustrated with similar sizes but not limited thereto. In other situations, the regions can be sized differently. The recesses 212a are at a distance R of about 1~5

μm from outer edges of the pattered passivation layer 212 and are illustrated with substantially rectangular configuration here, but is not limited thereto. The recesses 212 can be formed in other suitable shapes such as v-shaped, arcuate, semicircle or the like. The recesses 212a can be simultaneously formed during patterning of the passivation layer 212 for revealing the bond surface 214.

Figure 8:
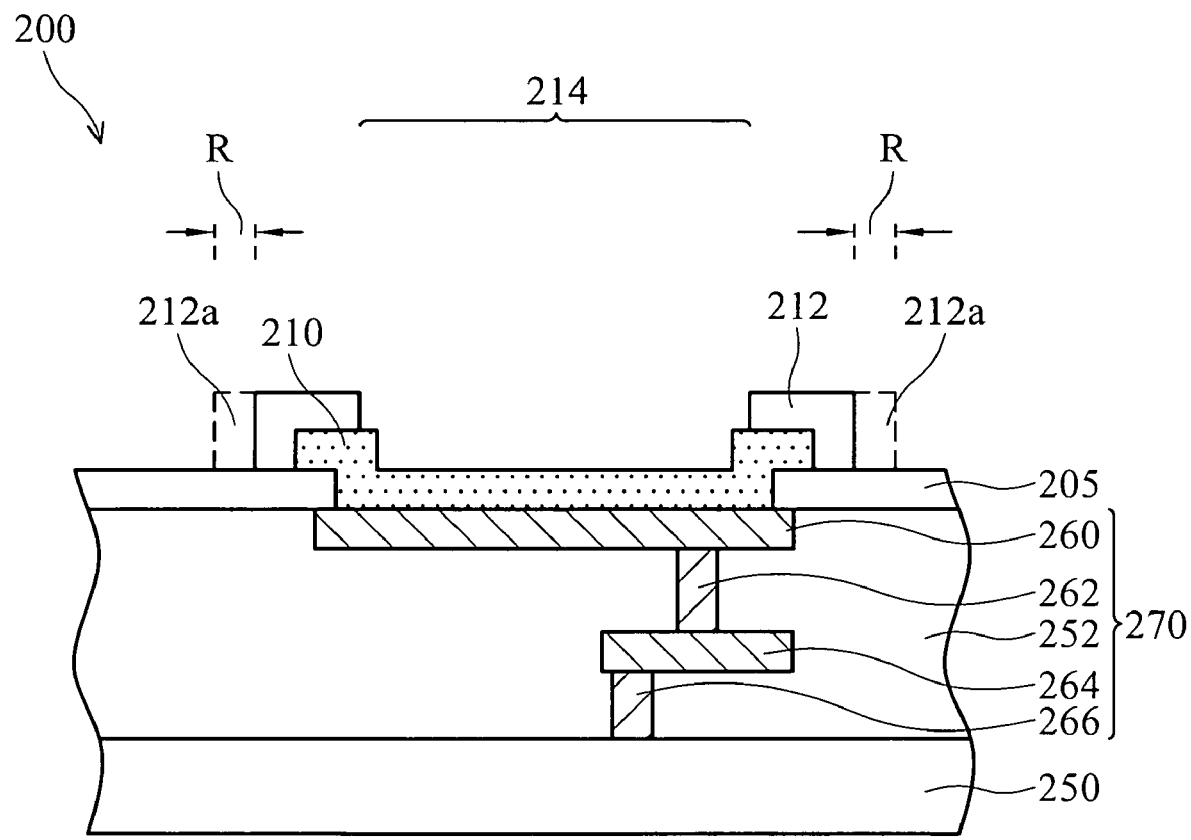
FIG. 8 is a schematic cross section taken along line 8-8 in FIG. 7, showing a bond pad structure according to an embodiment of the invention.

The bond pad structure 200 can be designed as a semiconductor device with a cross section as illustrated in FIG. 8, for example. FIG. 8 shows a cross section taken along the line 8-8 in FIG. 7 crossing over the recesses of the passivation layer 212. As shown in FIG. 8, the bond pad structure 200 has an interconnect region 270 overlying a substrate 250. The interconnect region 270 includes metal layers 260, 264 and metal plugs 262, 266 formed in a inter-metal dielectric (IMD) layer 252 for routing power, ground, signal, and other lines between various components. The passivation layer 205 is formed on the interconnect region 270 and has been patterned to expose a portion of the underlying metal layer 260. The bond pad layer 210 is further formed on the exposed portion of the metal layer 260 and the passivation layer 212 covers portions the bond pad layer 210 from edges thereof, thereby revealing the bond surface 214. As shown in FIG. 8, the recesses 212a with distances R form an edge of the passivation layer 212 are further provided in the passivation layer 212, thereby serving as marks for defining the wire bonding region 204 and the probe needle contact region 206 on the bond surface 214. The passivation layers 212 and 205 can comprise dielectric materials such as silicon nitride or silicon oxide for providing mechanical resistance and anti-moisture permeation characteristics for the adjacent metal layers and bond pad layer 210. The bond pad layer 210 can comprises conductive materials such as copper, aluminum or alloys thereof. Fabrications of the bond pad structure 200 can be achieved by conventional semiconductor fabricating techniques such as film depositions, photolithography, etching and the like, and are well known to those skilled in the art but are not described in detail here, for simplicity.

Figure 9:
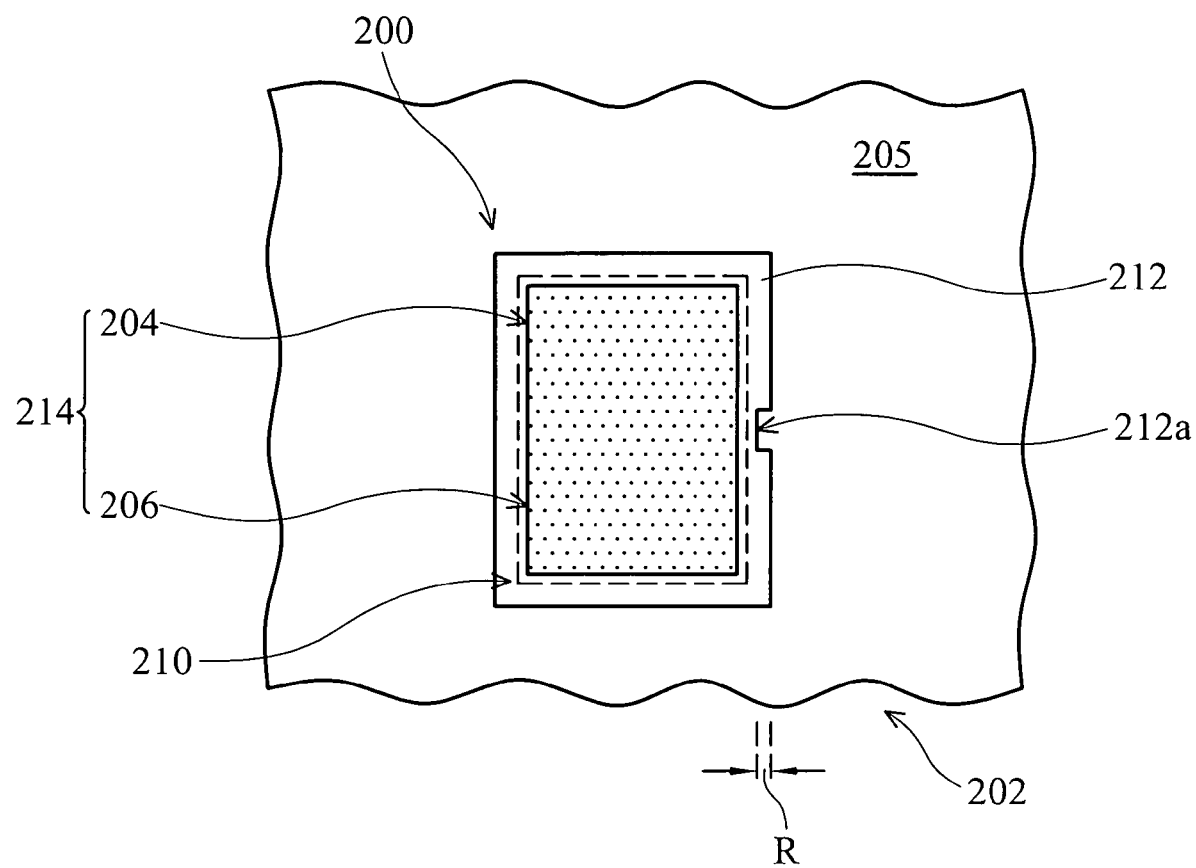
FIG. 9 is a top view of a bond pad structure according to still another embodiment of the invention.

As shown in FIG. 7, the recesses 212a with distances R from an outer edge of the patterned passivation layer 212 are provided and crosses over a portion of the underlying passivation layer 205, such that functioning as marks for defining the wire bonding region 204 and the probe needle contact region 206 on the bonding surface 214. The bond pad structure 200 can be also designed with only one recess 212a partially covering the bond surface 214 at a side thereof as the mark for defining the wire bonding region 204 and the probe needle contact region 206 thereon, as shown in FIG. 9, wherein the like or similar elements are given same reference numbers throughout the figure as that shown in FIG. 7.

Figure 10:
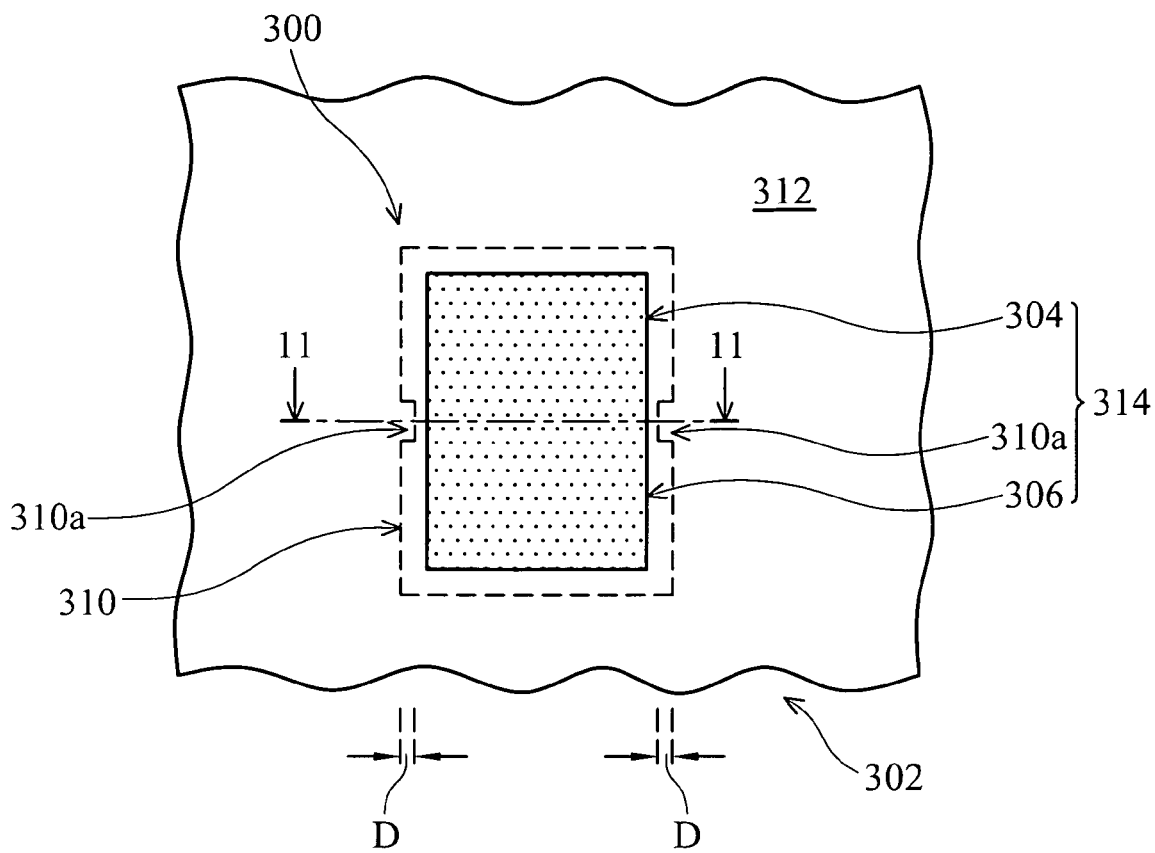
FIG. 10 is a top view of a bond pad structure according to still another embodiment of the invention.

FIG. 10 illustrates a top view of a part of yet another integrated circuit (IC) chip 302 having a bond pad structure 300 in accordance with an embodiment. The integrated circuit chip 302 is provided with a bond pad layer 310 partially covered by a passivation layer 312 from edges thereof and exposes a bonding surface 314. The passivation layer 312 covers the entire surface of the IC chip 302 and a portion of the bond pad layer 310 covered by the passivation layer 312 is now formed with a recess 310a on opposing sides thereof, thereby separating the bond surface 314 into a wire bonding region 304 and a probe needle contact region 306 at two ends thereof, as shown in FIG. 10. The wire bonding region 304 and the probe needle contact region 306 can be laid out and sized as needed to accommodate the size and accuracy of the wire bonding and probing tools through adjusting locations of the recesses 310a formed in the bond pad layer 310. As shown in FIG. 10, the wire bonding region 304 and the probe needle contact region 306 are illustrated with similar sizes but are not limited thereto. In other situations, the regions can be sized differently. The recesses 310a are in a distance D of about 0.5~5 μm from edges of the bond pad layer 310 and are illustrated with substantially rectangular configuration here, for example, but is not limited thereto. The recesses 310a can be formed in other suitable shapes such as v-shaped, arcuate, semicircle or the like. The recesses 310a can be simultaneously formed during patterning of the bond pad layer 310.

Figure 11:
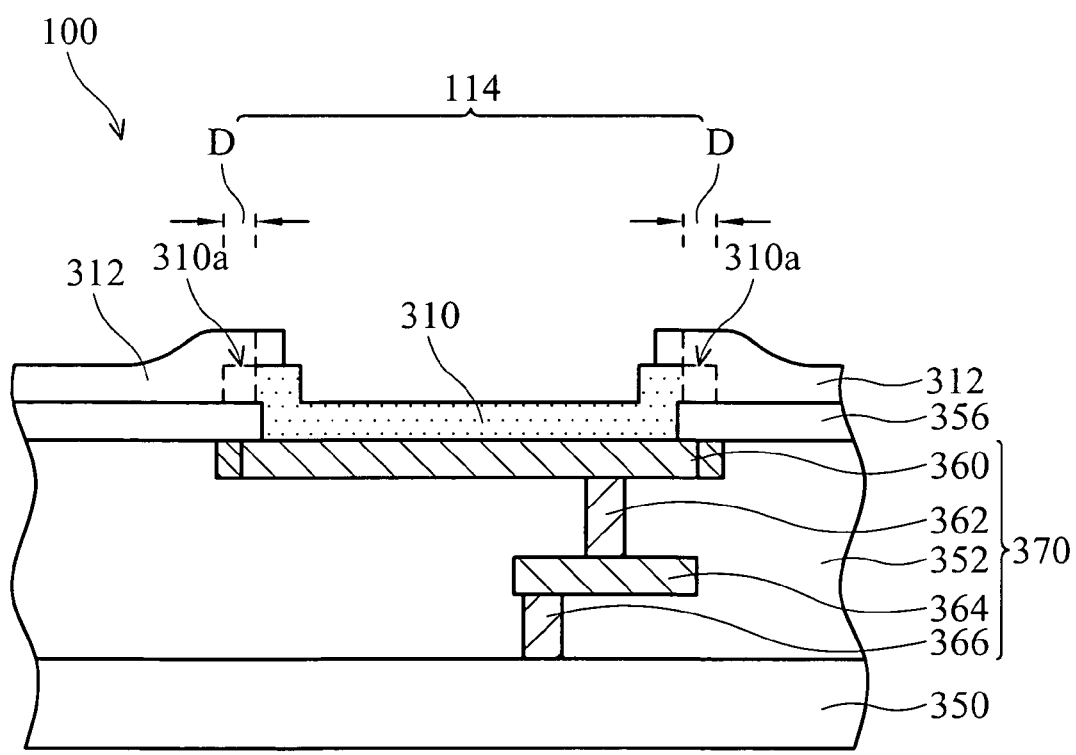
FIG. 11 is a schematic cross section taken along line 11-11 in FIG. 10, showing a bond pad structure according to an embodiment of the invention.

The bond pad structure 300 can be designed as a semiconductor device with a cross section as illustrated in FIG. 11, for example. FIG. 11 is a cross section taken along the line 11-11 in FIG. 10 which crosses over the recesses of the bond pad layer 310. As shown in FIG. 11, the bond pad structure 300 has an interconnect region 370 overlying a substrate 350. The interconnect region 370 includes metal layers 360, 364 and metal plugs 362, 366 formed in a inter-metal dielectric (IMD) layer 352 for routing power, ground, signal, and other lines between various components. A patterned passivation layer 356 is formed on the interconnect region 170 and exposes a portion of the underlying metal layer 360. The bond pad layer 310 is further formed on the exposed portion of the metal layer 360 and the topmost passivation layer 312 covers portions the bond pad layer 310 from edges thereof, thereby defining the bonding surface 314. The passivation layers 312 and 356 can comprise dielectric materials such as silicon nitride or silicon oxide for providing mechanical resistance and anti-moisture permeation characteristics for the adjacent metal layers and bond pad layer 310. The bond pad layer 310 can comprise conductive materials such as copper, aluminum or alloys thereof. Fabrications of the bond pad structure 300 can be achieved by conventional semiconductor fabricating techniques such as film depositions, photolithography, etching and the like, and are well known to those skilled in the art but are not described in detail here, for simplicity.

Figure 12:
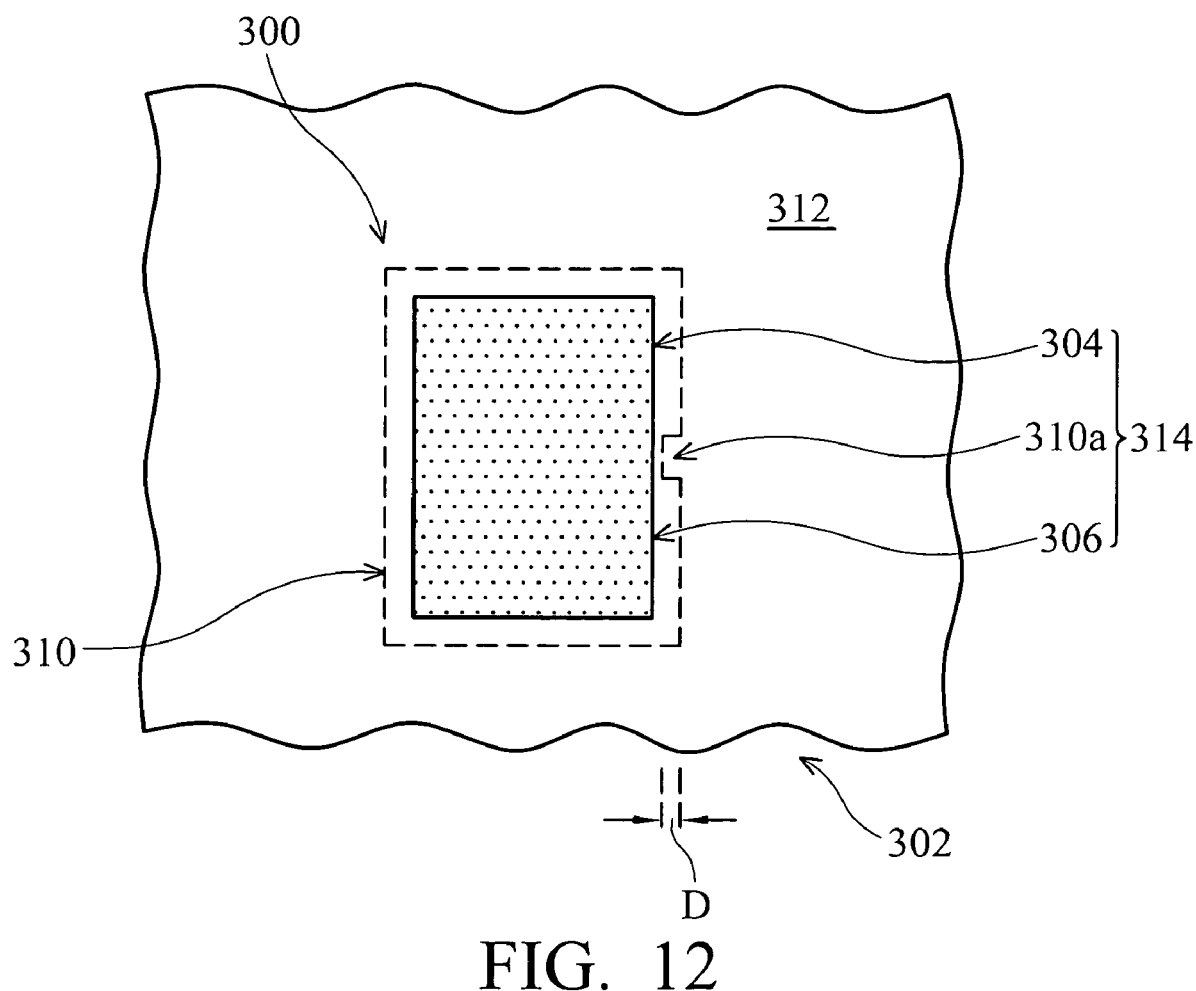
FIG. 12 is a top view of a bond pad structure according to still another embodiment of the invention.

As shown in FIG. 11, the recesses 310a with distances D form an edge of the bonding surface 314 are provided thereon and cross over a portion of the bond pad layer 310, such that functioning as marks for defining the wire bonding region 304 and the probe needle contact region 306 on the bonding surface 314. The bond pad structure 300 can be also designed with only one recess 310a partially covered by the passivation layer 312 at a side thereof as the mark for defining the wire bonding region 304 and the probe needle contact region 306 thereon, as shown in FIG. 12, wherein the like or similar elements are given same reference numbers as in FIG. 10.

Figure 13:
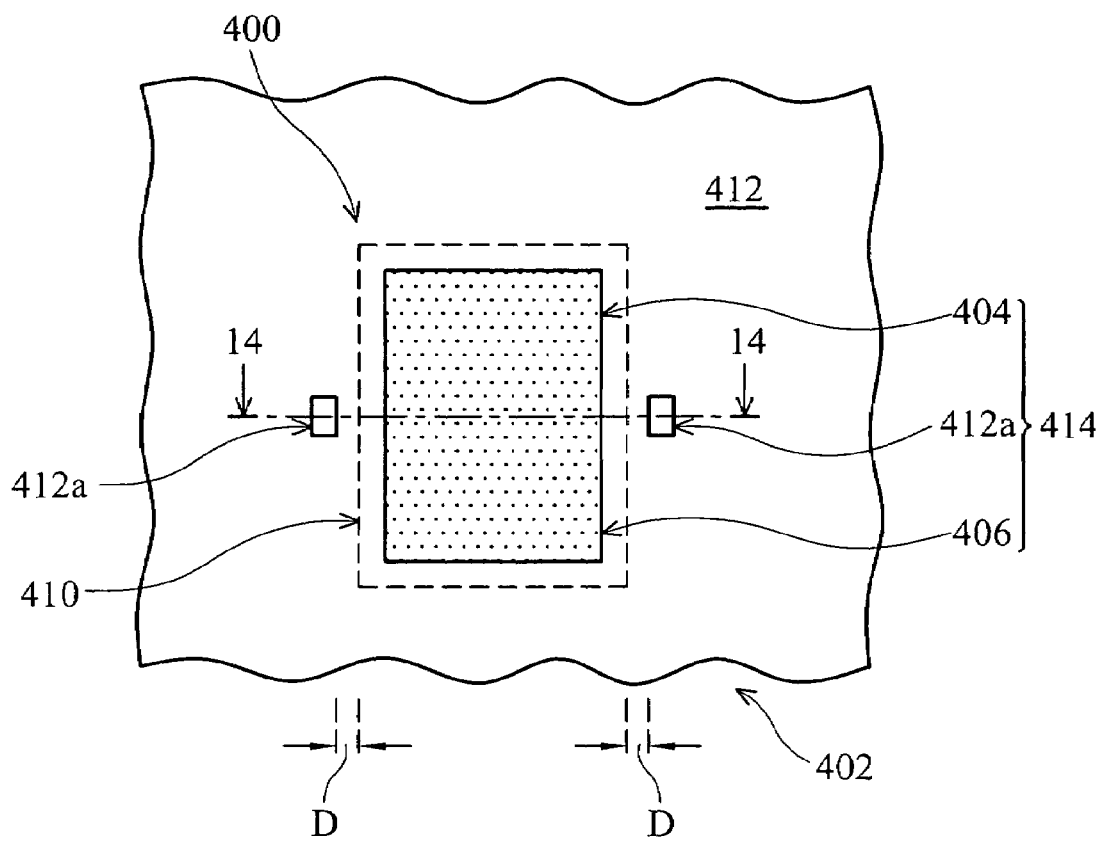
FIG. 13 is a top view of a bond pad structure according to still another embodiment of the invention.

FIG. 13 illustrates a top view of a part of still yet another integrated circuit (IC) chip 402 having a bond pad structure 400 in accordance with an embodiment. The integrated circuit chip 402 is provided with a bond pad layer 410 partially covered by a passivation layer 412 from edges thereof and exposes a bonding surface 414. The passivation layer 412 covers the entire surface of the IC chip 402 and a pair of openings 412a are formed in the passivation layer 412, exposing a portion of a underlying passivation layer 456, respectively, thereby defining the bond surface 314 into a wire bonding region 404 and a probe needle contact region 406 at two ends thereof, as shown in FIG. 13. The wire bonding region 404 and the probe needle contact region 406 can be laid out and sized as needed to accommodate the size and accuracy of the wire bonding and probing tools through adjusting locations of the openings 412a formed in the passivation layer 412. As shown in FIG. 13, the wire bonding region 404 and the probe needle contact region 406 are illustrated with similar sizes but are not limited thereto. In other situations, the regions can be sized differently. The openings 412a are in a distance D of about 0~5 μm from edges of the bond pad layer 410 and are illustrated with substantially rectangular configuration here, for example, but is not limited thereto. The openings 412a can be formed in other suitable shapes such as circle, triangle or other polygons. The openings 412a can be simultaneously formed during patterning of the passivation layer 412.

Figure 14:
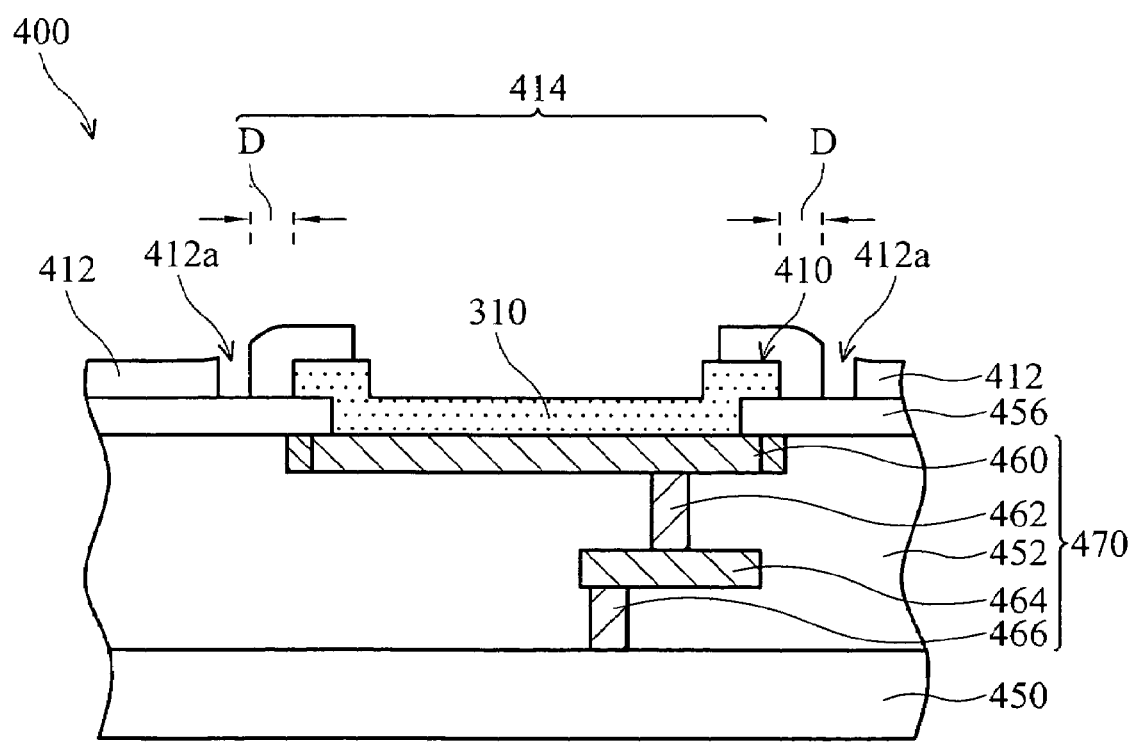
FIG. 14 is a schematic cross section taken along line 14-14 in FIG. 13, showing a bond pad structure according to an embodiment of the invention.

The bond pad structure 400 can be designed as a semiconductor device with a cross section as illustrated in FIG. 14, for example. FIG. 14 is a cross section taken along the line 14-14 in FIG. 13 which crosses over the openings 412a formed in the passivation layer 412. As shown in FIG. 14, the bond pad structure 400 has an interconnect region 470 overlying a substrate 450. The interconnect region 470 includes metal layers 460, 464 and metal plugs 462, 466 formed in a intermetal dielectric (IMD) layer 452 for routing power, ground, signal, and other lines between various components. A patterned passivation layer 456 is formed on the interconnect region 470 and exposes a portion of the underlying metal layer 460. The bond pad layer 410 is further formed on the exposed portion of the metal layer 460 and the topmost passivation layer 412 covers portions the bond pad layer 410 from edges thereof, thereby defining the bonding surface 414. The passivation layers 412 and 456 can comprise dielectric materials such as silicon nitride or silicon oxide for providing mechanical resistance and anti-moisture permeation characteristics for the adjacent metal layers and bond pad layer 410. The bond pad layer 410 can comprise conductive materials such as copper, aluminum or alloys thereof. Fabrications of the bond pad structure 400 can be achieved by conventional semiconductor fabricating techniques such as film depositions, photolithography, etching and the like, and are well known to those skilled in the art but are not described in detail here, for simplicity.

Figure 15:
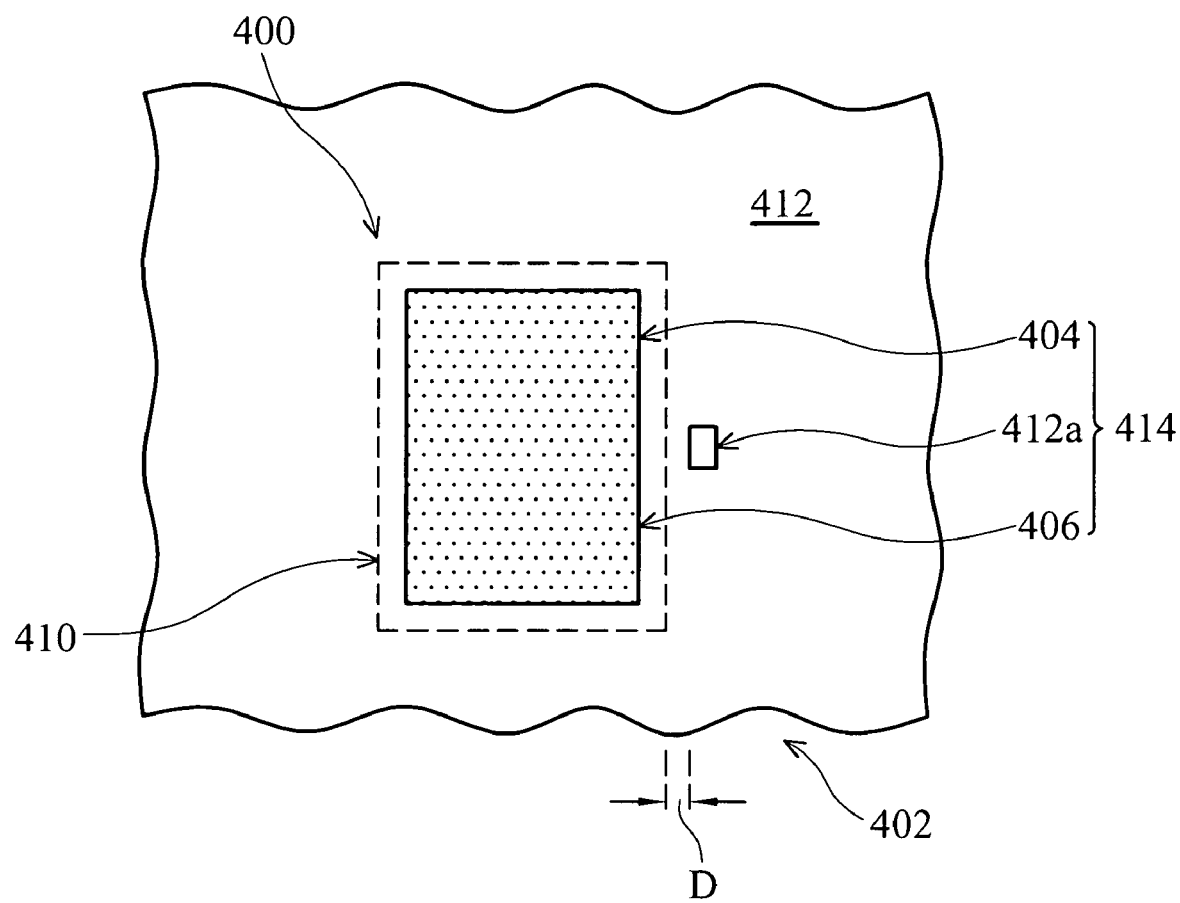
FIG. 15 is a top view of a bond pad structure according to still another embodiment of the invention.

As shown in FIG. 14, the openings 412a with distances D form an edge of the bond pad layer 410 are provided thereon, such that functioning as marks for defining the wire bonding region 404 and the probe needle contact region 406 on the bonding surface 414. The bond pad structure 400 can be also designed with only one opening 412a formed in the passivation layer 412 at a side thereof as the mark for defining the wire bonding region 404 and the probe needle contact region 406 thereon, as shown in FIG. 15, wherein the like or similar elements are given same reference numbers as in FIG. 13.

Figure 16:
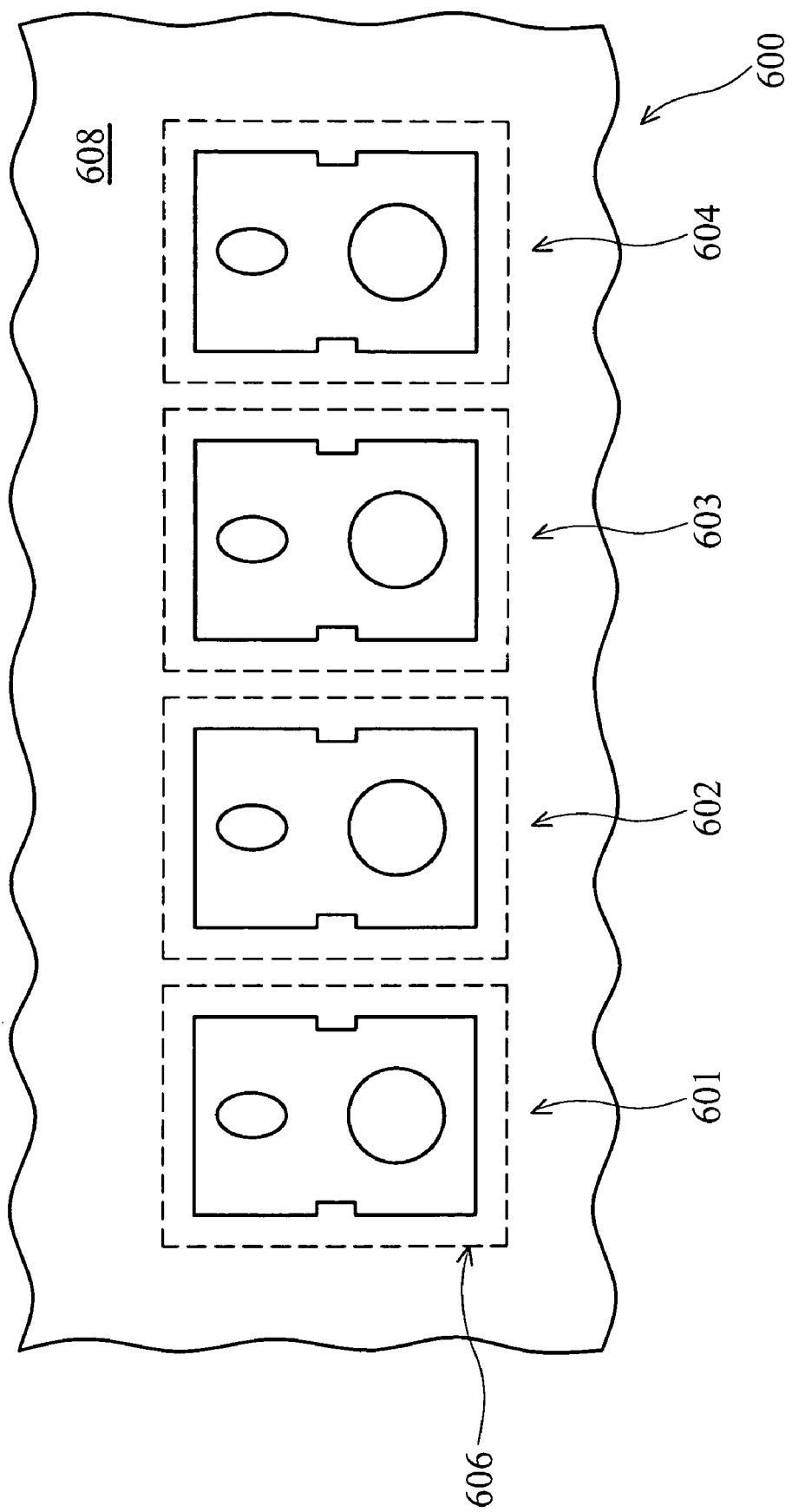
FIGS. 16-23 are schematic top views respective showing a part of an integrated circuit chip fabricated with a plurality of bond pad structures according to various embodiments of the invention.

FIGS. 16-23 show various embodiments of an IC chip with a plurality of the bonding pad structures fabricated thereon. FIG. 16 illustrates a top view of an IC chip 600 fabricated with a plurality of bond pad structures 601-604 similar to the bond pad structure 100 illustrated in FIG. 4. In FIG. 16, the bond pad structures 601-604 are arranged as a bond pad array over the integrated circuit chip 600. The dashed line in each of the plurality of bond pad structures indicates a bond pad layer 606 partially covered by a passivation layer 608. Each of the bond pad structures is separated into probe needle contact regions and wire bonding regions as discussed in FIG. 4. As shown in FIG. 16, the area on each bond pad structures bounded by an oval is the area designated generally for probe needle contact and the area on each bond pad bounded by a circle is the area designated generally for wire bonding and may be interchanged in other embodiments.

Figure 17:
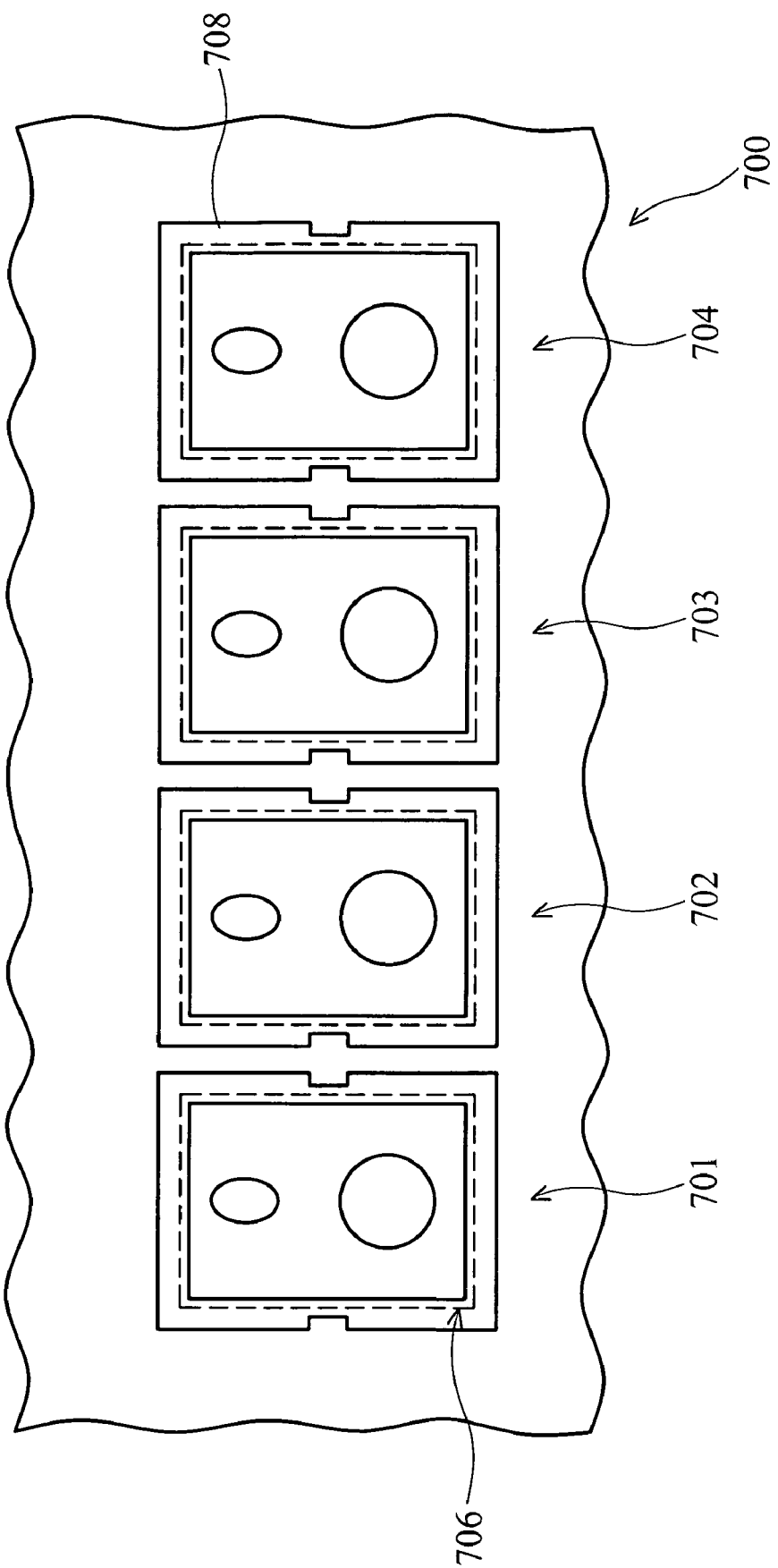

FIG. 17 illustrates a top view of an IC chip 700 fabricated with a plurality of bond pad structures similar to the bond pad structure illustrated in FIG. 7. The integrated circuit chip 700 includes a plurality of bond pad structures 701-704 arranged as a bond pad array thereon. The dashed line on each of the plurality of bond pad structures indicates a bond pad layer 706 partially covered by a patterned passivation layer 708, respectively. Each of the bond pad structures is separated into probe needle contact regions and wire bonding regions as discussed in FIG. 7. The area on each bond pad structure bounded by an oval is the area generally designated for probe needle contact and the area on each bond pad bounded by a circle is the area generally designated for wire bonding and may be interchanged in other embodiments.

Figure 18:
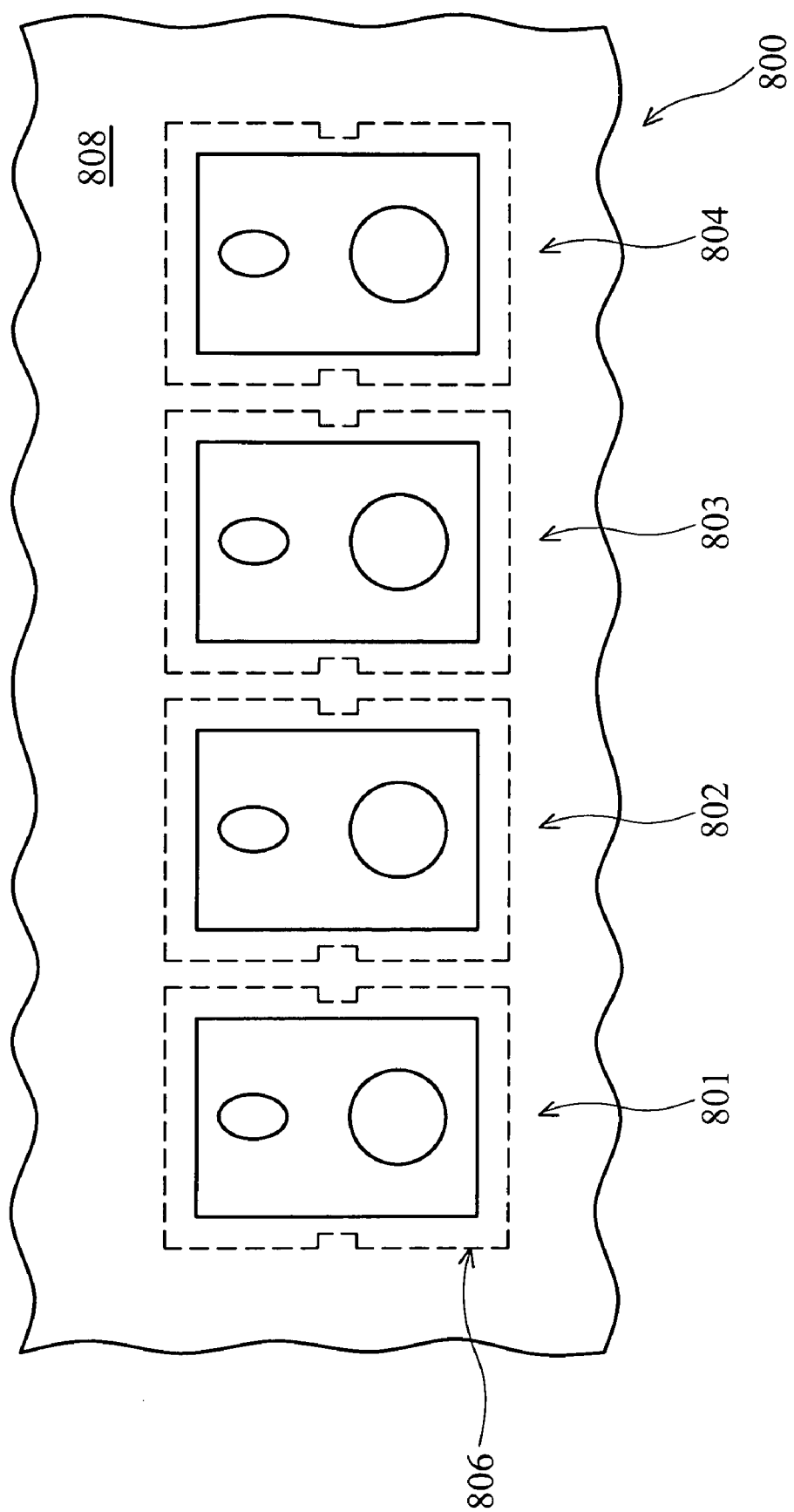

FIG. 18 illustrates a top view of an IC chip 800 fabricated with a plurality of bond pad structures similar to the bond pad structure illustrated in FIG. 10. The integrated circuit chip 800 includes a plurality of bond pad structures 801-804 arranged as a bond pad array thereon. The dashed line on each of the plurality of bond pad structures indicates a bond pad layer 806 covered by a patterned passivation layer 808, respectively having recesses therein. Each of the bond pad structures is separated into probe needle contact regions and wire bonding regions as discussed in FIG. 10. The area on each bond pad structure bounded by an oval is the area generally designated for probe needle contact and the area on each bond pad bounded by a circle is the area generally designated for wire bonding and may be interchanged in other embodiments.

Figure 19:
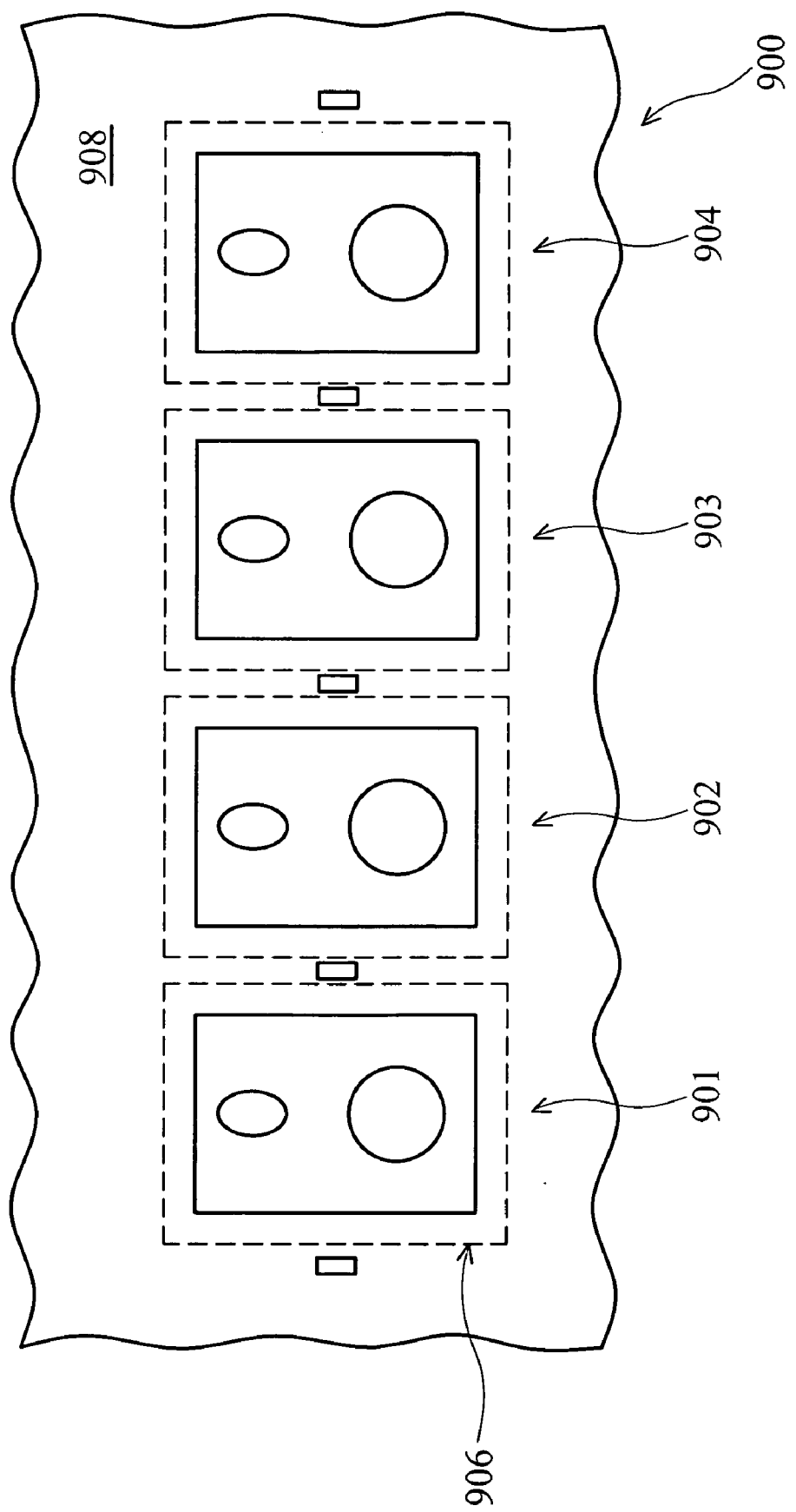

FIG. 19 illustrates a top view of an IC chip 900 fabricated with a plurality of bond pad structures similar to the bond pad structure illustrated in FIG. 13. The integrated circuit chip 900 includes a plurality of bond pad structures 901-904 arranged as a bond pad array thereon. The dashed line on each of the plurality of bond pad structures indicates a bond pad layer 906 covered by a patterned passivation layer 908, respectively. Each of the bond pad structures is separated into probe needle contact regions and wire bonding regions as discussed in FIG. 13. The area on each bond pad structure bounded by an oval is the area generally designated for probe needle contact and the area on each bond pad bounded by a circle is the area generally designated for wire bonding and may be interchanged in other embodiments.

Figure 20:
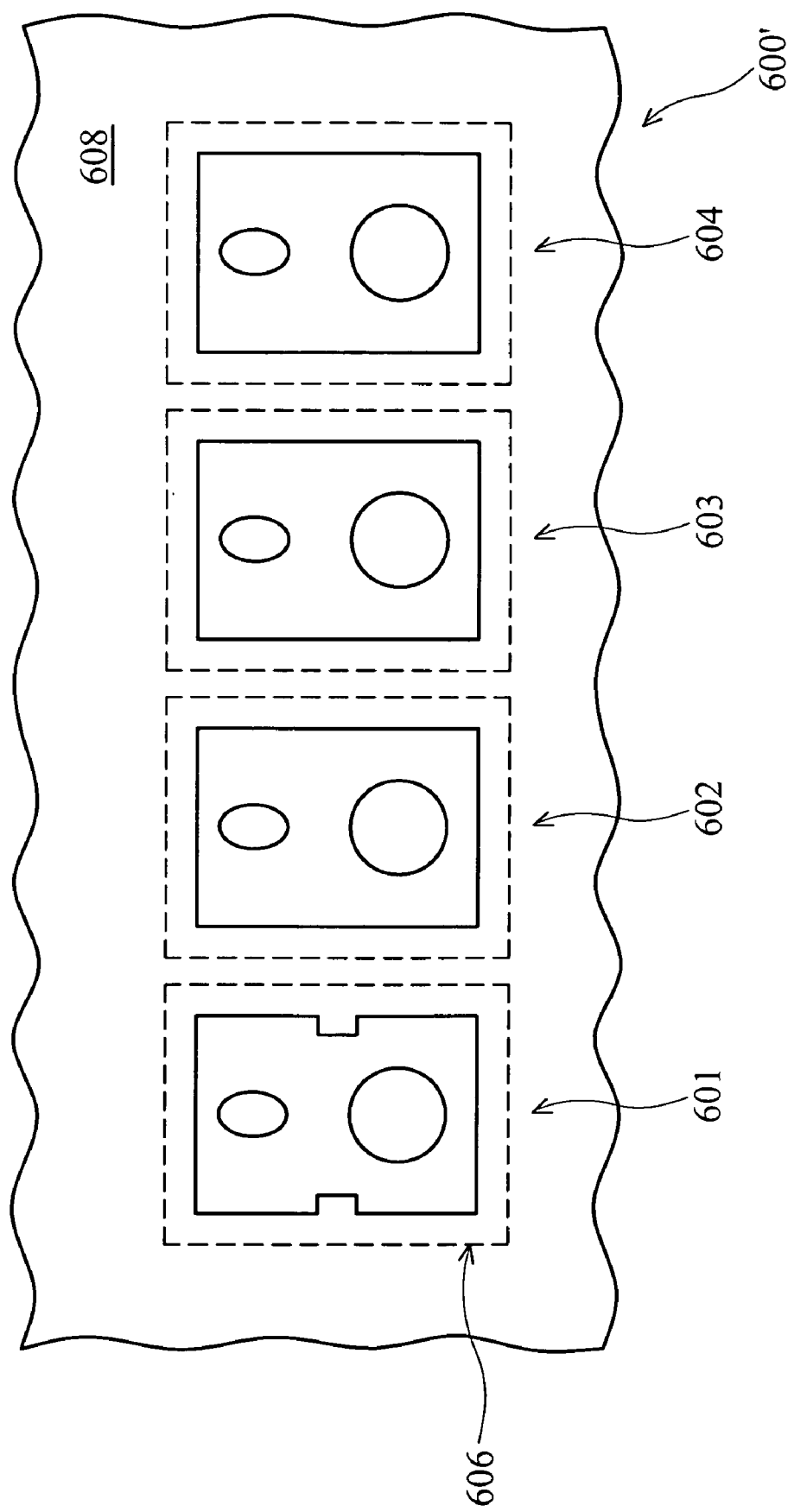

FIG. 20 illustrates a top view of an IC chip 600' similar to the IC chip 600 illustrated in FIG. 16 and is fabricated with a plurality of bond pad structures thereon. Compared with the IC chip 600 in FIG. 16, only one of the plurality of bond pad structures is similar to the bond pad structure illustrated in FIG. 4, the rest are formed as conventional a bond pad structure.

Figure 21:
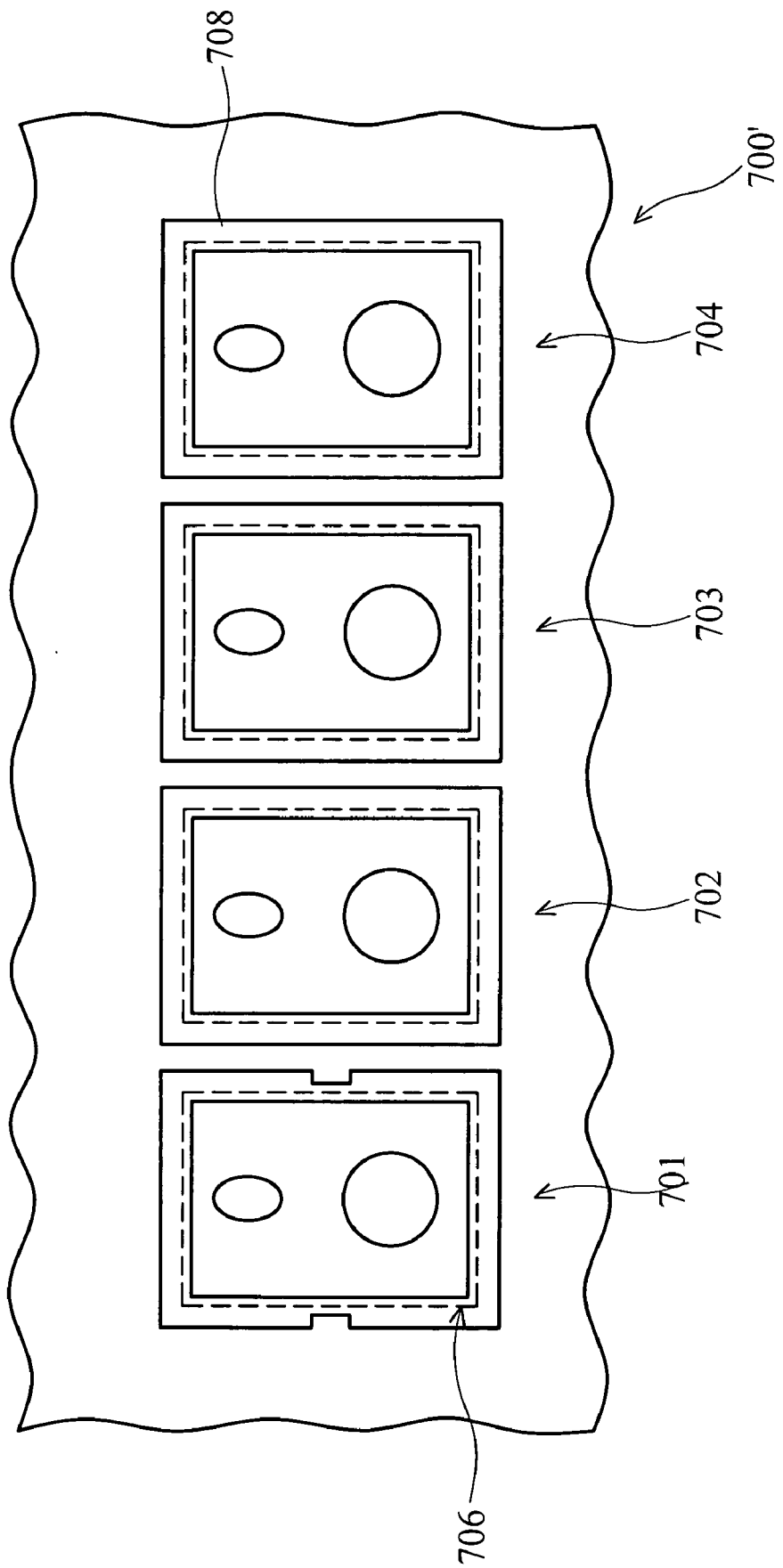

FIG. 21 illustrates a top view of an IC chip 700' similar to the IC chip 700 illustrated in FIG. 17 and is fabricated with a plurality of bond pad structures thereon. Compared with the IC chip 700 illustrated in FIG. 21, only one of the plurality of bond pad structures is similar to the bond pad structure illustrated in FIG. 7, the rest are formed as a conventional bond pad structure.

Figure 22:
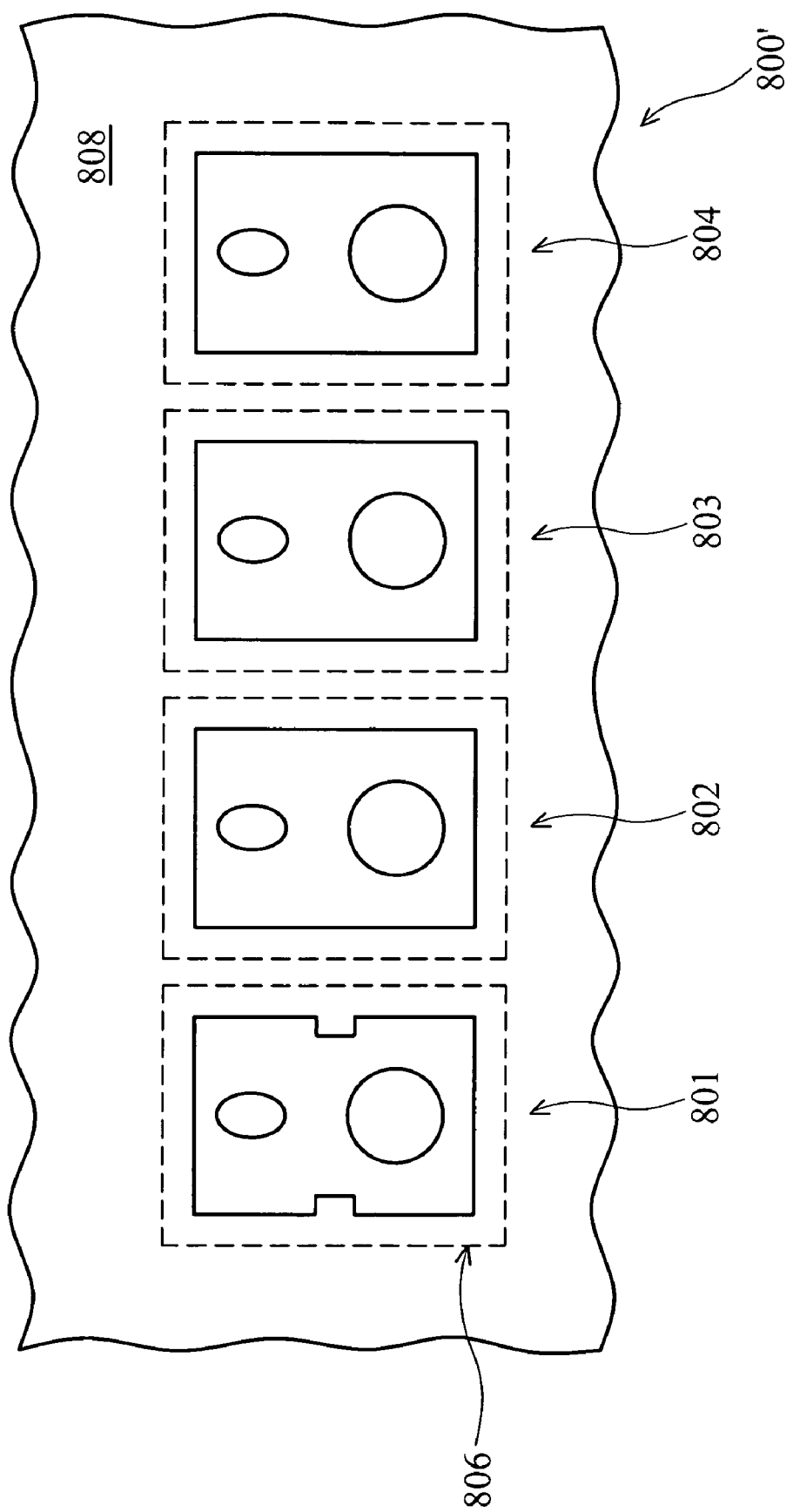

FIG. 22 illustrates a top view of an IC chip 800' similar to the IC chip 800 illustrated in FIG. 18 and is fabricated with a plurality of bond pad structures thereon. Compared with the IC chip 800 in FIG. 18, only one of the plurality of bond pad structures is similar to the bond pad structure illustrated in FIG. 10, the rest are formed as conventional a bond pad structure.

Figure 23:
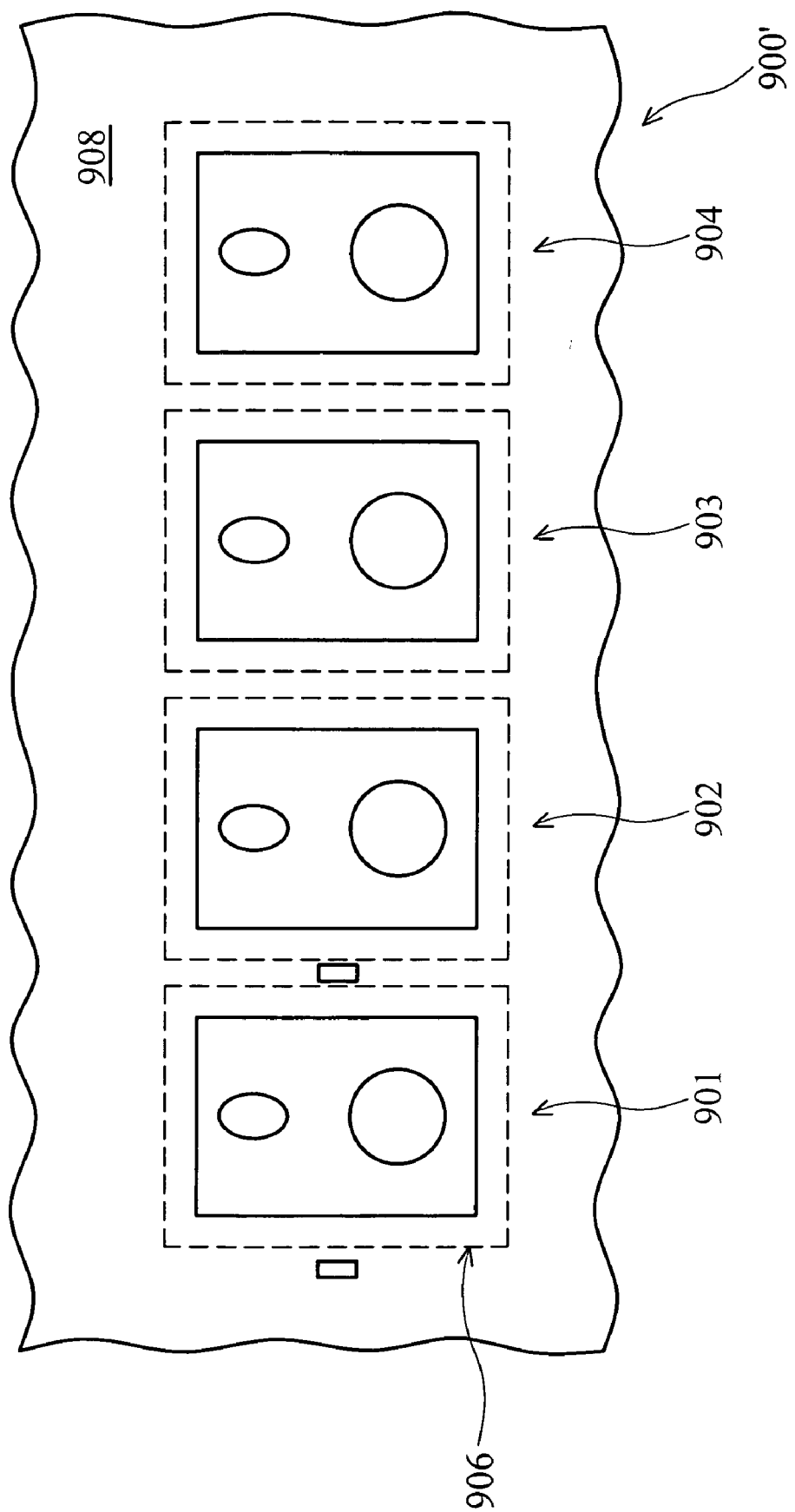

FIG. 23 illustrates a top view of an IC chip 900' similar to the IC chip 900 illustrated in FIG. 19 and is fabricated with a plurality of bond pad structures thereon. Compared with the IC chip 900 in FIG. 19, only one of the plurality of bond pad structures is similar to the bond pad structure illustrated in FIG. 13, the rest are formed as conventional a bond pad structure.

Due to the presence of the marks illustrated in FIGS. 4, 7, 10 and 13, the bond pad structures illustrated in FIGS. 16-23 can be maintained in a line with a finer pitch therebetween, since the desired region for probe needle contact or wire bonding can be precisely distinguished on each bond pad structure by an test tool with probe cards or wire bonding tool through the use of the such marks as alignment marks. Therefore, the process window of wire bonding or probe needle contact can be enlarged even in the trend of bond pad size reduction. Moreover, since the above marks can be simultaneously formed during patterning of the adjacent passivation layer, no extra cost or process changes are required. Furthermore, the figurations of the mark, and arrangement and number of the bond pad structures having such marks can be varied and are not limited to those illustrated in FIGS. 16-23. One or more bond pad structures may have such marks and the marks can be periodically or randomly formed in such bond pad array within the scope of the invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bond pad structure comprising:
   a dielectric layer exposed with a bond pad layer; and
   a passivation layer partially overlying the dielectric layer, covering the bond pad layer from edges thereof and exposing a bonding surface therein, wherein the passivation layer is formed with at least one opening enclosed by sides thereof neighboring one side of the bond pad layer, defining a probe needle contact area for probe needle testing and a wire bonding area for wire bonding on the bonding surface, the probe needle contact area and the wire bonding area have a non-overlapping relationship, wherein the at least one opening exposes an underlying passivation layer between the passivation layer and the dielectric layer, the at least one opening has an bottom surface, and the entire bottom surface of the opening is the underlying passivation layer.

2. The bonding pad structure of claim 1, wherein the opening is in a distance D of about 0-5 µm from an edge of the bond pad layer.

3. The bonding pad structure of claim 1, wherein the bond pad layer comprises aluminum, copper, or alloys thereof.

4. The bonding pad structure of claim 1, wherein the opening has rectangular configuration and is enclosed by four sides.

5. The bonding pad structure of claim 1, wherein the at least one opening comprises two openings neighboring opposite sides of the bond pad layer.

6. An integrated circuit chip, comprising:
   a dielectric layer exposed with a plurality of bond pads thereon; and
   a plurality of patterned passivation layers overlying portions of the dielectric layer, each partially covering one of the bond pad layers from edges thereof and respectively exposing a bonding surface therein, wherein at least one of the patterned passivation layers is formed with at least one opening enclosed by sides thereof neighboring one side of one of the bond pad layers, defining a probe needle contact area for probe needle testing and a wire bonding area for wire bonding on the bonding surface, the probe needle contact area and the wire bonding area have a non-overlapping relationship, and the patterned passivation layers covering two adjacent bond pads are isolated form each other by a gap over the dielectric layer defined therebetween, wherein the at least one opening exposes an underlying passivation layer between the passivation layer and the dielectric layer, the at least one opening has an bottom surface, and the entire bottom surface of the opening is the underlying passivation layer.

7. The integrated circuit chip of claim 6, wherein the opening is in a distance D of about 0-5 µm from an edge of the bond pad layer.

8. The integrated circuit chip of claim 6, wherein the bond pads comprise aluminum, copper, or alloys thereof.

9. The integrated circuit chip of claim 6, wherein the opening has rectangular configuration and is enclosed by four sides.

10. The integrated circuit chip of claim 6, wherein the at least one opening comprises two openings neighboring opposite sides of the bond pad layer.

* * * * *